(12) United States Patent
Sagebiel et al.

(10) Patent No.: US 8,451,061 B2
(45) Date of Patent: May 28, 2013

(54) AMPLIFICATION OF AN INCOMING SIGNAL RECEIVED VIA AN ANTENNA

(75) Inventors: Michael Sagebiel, Leingarten (DE); Stephan Gerlach, Flein (DE)

(73) Assignee: Atmel Corporation, San Jose, CA (US)

(*) Notice: Subject to any disclaimer, the term of this patent is extended or adjusted under 35 U.S.C. 154(b) by 83 days.

(21) Appl. No.: 13/227,399

(22) Filed: Sep. 7, 2011

(65) Prior Publication Data
US 2012/0056674 A1 Mar. 8, 2012

Related U.S. Application Data

(60) Provisional application No. 61/380,947, filed on Sep. 8, 2010.

(30) Foreign Application Priority Data

Sep. 7, 2010 (DE) .......................... 10 2010 044 592

(51) Int. Cl.
*H03F 1/08* (2006.01)
(52) U.S. Cl.
USPC .......................................... 330/293; 330/279
(58) Field of Classification Search
USPC .................................. 330/293, 279, 294, 278
See application file for complete search history.

(56) References Cited

U.S. PATENT DOCUMENTS

| 3,891,934 | A | | 6/1975 | Norton | |
|---|---|---|---|---|---|
| 4,611,179 | A | * | 9/1986 | Matsuura | 330/293 |
| 4,775,842 | A | * | 10/1988 | Rumreich | 330/103 |
| 5,045,808 | A | * | 9/1991 | Taylor | 330/277 |
| 5,045,810 | A | * | 9/1991 | Perroud et al. | 330/293 |
| 5,805,023 | A | * | 9/1998 | Fukuden | 330/302 |
| 6,782,062 | B1 | | 8/2004 | Wieck | |

FOREIGN PATENT DOCUMENTS

DE  102010044592.4-35   9/2010

OTHER PUBLICATIONS

Office Action for German Patent Application 10 2010 044 592.4, Apr. 13, 2011.

* cited by examiner

*Primary Examiner* — Henry Choe
(74) *Attorney, Agent, or Firm* — Baker Botts LLP

(57) ABSTRACT

In one embodiment, a method includes receiving a radio frequency (RF) at an antenna; generating negative feedback to linearize an amplifier by resistively or transformer coupling an output signal of a transistor of the amplifier to the input of the transistor; generating a rectified voltage by rectification of the output signal of the transistor; generating a constant reference voltage; and outputting a control voltage or a control current to the transistor based on the sum of the reference voltage and a first voltage derived from the rectified voltage. The output of the control voltage or control current facilitates control of an operating point of the transistor.

20 Claims, 5 Drawing Sheets

AMPLIFICATION OF AN INCOMING SIGNAL RECEIVED VIA AN ANTENNA

RELATED APPLICATIONS

This application claims the benefit, under 35 U.S.C. §119(e), of U.S. Provisional Patent Application No. 61/380,947, filed 8 Sep. 2010. This application also claims the benefit, under 35 U.S.C. §119(a), of German Patent Application No. 102010044592.4-35, filed 7 Sep. 2010.

TECHNICAL FIELD

This disclosure generally relates to circuits that have amplifiers.

BACKGROUND

An amplifier is a device for increasing the power of a signal, where a signal is usually a voltage or a current.

DESCRIPTION OF EXAMPLE EMBODIMENTS

Figure 1:
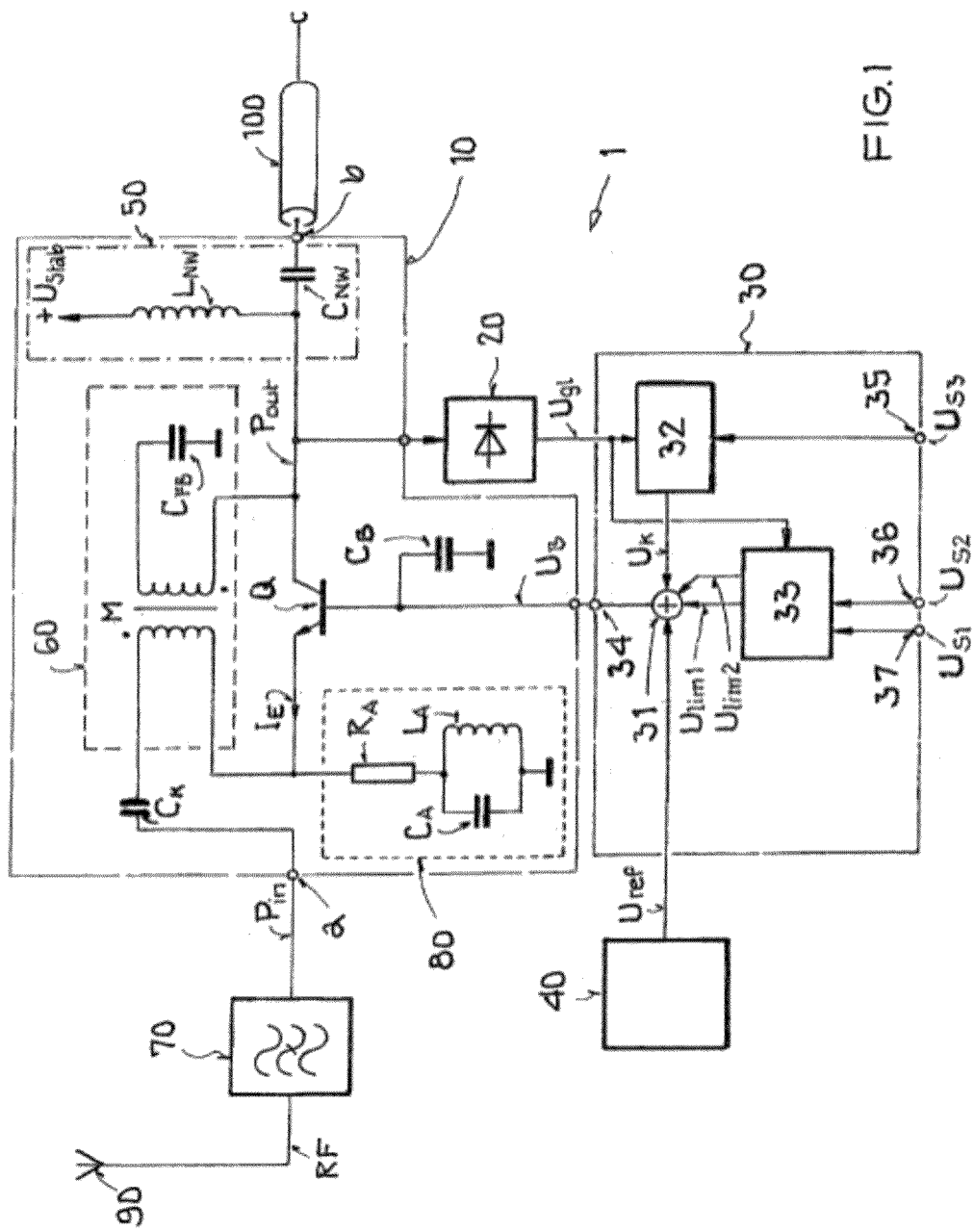
FIG. 1 is a schematic circuit diagram of an example embodiment.

This disclosure generally relates to a circuit and a method for amplifying an incoming signal that was received via an antenna.

U.S. Pat. No. 3,891,934 describes an amplifier for a coaxial cable with a bipolar transistor. The output of the transistor is coupled to the input of the transistor by transformer coupling.

Particular embodiments improve a circuit for amplifying an incoming signal received via an antenna to the extent possible.

Particular embodiments provide a circuit for amplifying an incoming signal that was received via an antenna. The incoming signal is an analog radio signal (FM radio, VHF, TV), for example, or a digital radio signal (DAB, DRM, HD radio, DVB-T). The output of the circuit is connected via a signal transmission line, such as a coaxial cable, with a receiver, such as an infotainment system.

The circuit has a transistor for amplification that may be connected with the antenna. In this context, the transistor is a component of an amplifier. The transistor may be operated for amplifying the incoming signal in an operating point. The transistor may be connected with a coupling device, wherein the coupling device is set up for negative feedback.

The circuit has a data-entry terminal that may be connected with the transistor. The data entry-terminal is set up for the output of a rectified voltage by rectification of the output signal of the transistor. In a first embodiment, the data-entry terminal is connected to the transistor. In a second embodiment, the data-entry device is connected with an output impedance of the transistor or with an output impedance of the amplifier. The data-entry device has a voltage rectifier with a high input impedance.

The circuit has a reference voltage source for the output of a constant reference voltage.

In particular embodiments, the circuit has a control device. The control device is connected with the transistor, the data-entry device and with the reference voltage source for controlling the operating point of the transistor. The control device is set up to adjust a control voltage or a control current by summation of the reference voltage and at least from one voltage derived from the rectified voltage, wherein the operating point of the transistor is based upon the control voltage or the control current.

In particular embodiments, the amplifier may also be operated with larger input power levels without automatic gain control (AGC). In this way, no current consumption is needed for AGC. At the same time this also achieves the benefit of a lower noise factor for low input power levels and a high signal-to-intermodulation ratio for large input power levels. Due to the frequently lower levels of input power this moreover has the advantage that the average current consumption of the transistor of the amplifier is reduced.

Particular embodiments indicate an improved method for amplifying an incoming signal that is received via an antenna.

Particular embodiments provide a method for the control of a negative feedback amplifier, which is set up for amplification of an incoming signal received via an antenna.

In particular embodiments, one operating point of a transistor of the amplifier is controlled by a control device.

In particular embodiments, for negative feedback, an output signal of the transistor is resistively coupled to the input of the transistor or by a transformer coupling.

In particular embodiments, a rectified voltage is created by rectification of the output signal of the transistor.

In particular embodiments of the control device, a reference voltage and at least one voltage derived from the rectified voltage are added up. Based upon this sum, a control voltage or a control current formed from the sum is output to the transistor of the amplifier for the adjustment of the operating point.

In particular embodiments, the control voltage or the control current is adjusted such that an emitter current flowing through the transistor for adjusting the operating point is controlled along a characteristic curve. In one range of the characteristic curve, in which the rectified voltage increases, the emitter current is raised by adjusting the control voltage or the control current. Outside of this range, the emitter current may be essentially constant.

In particular embodiments, the circuit has an amplifier the input of which may be connected with the antenna. Particular embodiments provide, for example, further elements in the signal path between antenna and amplifier, such as an interposed bandpass filter.

In particular embodiments, for the amplification of the incoming signal, the amplifier has a transistor that may be operated in an operating point and having a base, an emitter, and a collector. In particular embodiments, for example, the transistor may be a npn-bipolar transistor or a pnp-bipolar transistor.

In particular embodiments, the input and one output of the amplifier may be connected with a coupling device for transformer coupling of an output signal of the amplifier to the input of the amplifier. In this instance, the coupling device produces negative feedback that linearizes the amplifier. In particular embodiments, for example, for the transformer coupling, the coupling device may have a transformer or conductor loops of a printed circuit board. In particular embodiments, for high frequencies, the transformer coupling may be formed through conductor loops on a semiconductor chip.

In particular embodiments, the circuit may be a data-entry device that may be connected with the output of the amplifier and may be set up for the output of a rectified voltage by rectification of the output signal of the amplifier. In particular embodiments, for example, the data-entry device has a diode rectifier for rectification. Particular embodiments of the data-entry device may have a threshold switch, wherein the rectified voltage is output only above a threshold value of the threshold switch.

The circuit has a reference voltage source for the output of a constant reference voltage. In particular embodiments, for example, the reference voltage source has a so-called bandgap circuit and a voltage divider for the output of the reference voltage.

In particular embodiments, the circuit has a control device. The control device is connected with the base of the transistor of the amplifier and with the data-entry device, and with the reference voltage source for control of the operating point of the transistor. The control device is set up to adjust a base voltage on the base of the transistor of the amplifier by summation of the reference voltage and at least from one voltage derived from the rectified voltage.

In particular embodiments, the transistor of the amplifier is interposed in the base circuit. For this purpose, the emitter of the transistor is connected with the input of the amplifier. The coupling device may be connected to the collector and to the emitter of the transistor.

In particular embodiments, the coupling device is designed for transformer coupling. In particular embodiments, at least two separate conductor loops are provided for transformer coupling, which is caused by the significant overlapping of the conductor loops. In particular embodiments, for example, a transformer is provided for transformer coupling.

In particular embodiments, the coupling device is designed for resistive coupling. In particular embodiments, for example, for resistive coupling, a resistor is provided between an output (collector) and an input (base/emitter) of the inverting transistor that amplifies the incoming signal.

In particular embodiments, the control voltage is a base voltage of the transistor in its operating point. For this purpose, the control device is set up for the direct output of the base voltage.

In particular embodiments, the control current is an emitter current through the transistor, wherein the control device is set up for the output of the emitter current.

In particular embodiments, both the reference voltage source as well as the control device are designed for temperature compensation.

In particular embodiments, the control device for adjusting the base voltage is set up such that an emitter current may be controlled by the transistor along a characteristic curve dependent upon the rectified voltage. The control device is set up to increase the emitter current by adjusting the base voltage in the range of the characteristic curve in which the rectified voltage increases.

In particular embodiments, the control device is set up to form a lower current limitation of the characteristic curve of the emitter current by means of a first voltage derived from the rectified voltage.

In particular embodiments, the control device is set up to form an upper current limitation of the characteristic curve of the emitter current by means of a second voltage derived from the rectified voltage.

In particular embodiments, the control device is set up to form a slope of the characteristic curve of the emitter current by means of a third voltage derived from the rectified voltage.

Particular embodiments are advantageous both individually as well as in combination.

In FIG. 1, an example antenna booster is represented schematically by a block diagram. The represented circuit 1 is set up for amplification of an incoming radio frequency (RF) signal. The received RF signal in the example of FIG. 1 is received by an antenna 90.

The circuit 1 has an amplifier 10 for amplification of the received RF signal. The amplifier 10 has a transistor Q with a base, an emitter, and a collector. The transistor Q in the example of FIG. 1 is a npn-bipolar transistor. Alternatively (not shown), in particular embodiments, a pnp-bipolar transistor or a field effect transistor may be used. The transistor Q in FIG. 1 is interposed in the base circuit. For interconnection in the base circuit, the emitter of the transistor Q is connected with an input a of the amplifier 10 and the collector of the transistor Q is connected with an output b of the amplifier 10. The interconnection in the base circuit achieves high amplification with a high cutoff frequency and a high linearity.

In particular embodiments, the transistor Q is operated in an operating point. The operating point is adjustable for optimum amplification characteristics. In the operating point, a constant operating point current flows from a stabilized voltage source $U_{Stab}$ via an inductance $L_{NW}$, via the collector-emitter path of the transistor Q, via a resistor $R_A$ and a further inductance $L_A$ to ground. The inductance $L_{NW}$ in synergy with the capacitance $C_{NW}$ is used for adapting the output impedance of the amplifier 10 to the transmission line 100. Using the parallel-resonant circuit from the further inductance $L_A$ and a further capacitance $C_A$, the network 80 causes a high impedance for the received RF signal and influences the received RF signal therefore only insignificantly. An emitter current $I_E$ of the transistor Q is the sum of a base current in the operating point and of the operating point current via the collector-emitter path of the transistor Q. In FIG. 1, the emitter current $I_E$ is adjustable by a base voltage $U_B$ of the transistor Q and by the resistor $R_A$ connected to the emitter of the transistor Q.

Figure 2:
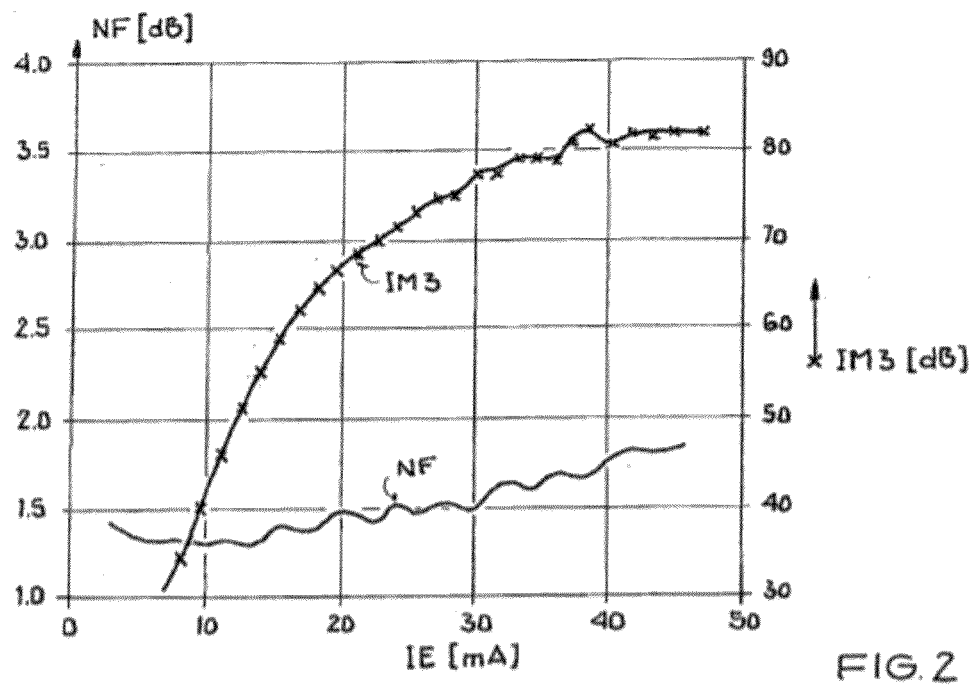
FIG. 2 is a schematic diagram of an example noise factor and an example signal-to-intermodulation ratio dependent upon an emitter current.

In particular embodiments, the transistor Q of the amplifier 10 contains noise sources that may cause the signal-to-noise ratio from the input to the output to deteriorate. A measure for this deterioration is the noise factor NF, which it may be advantageous to keep as small as possible in this circuit. FIG. 2 shows an example diagram, in which a noise factor NF in dB (on the left side) is represented in mA via the emitter current $I_E$. The minimum noise is therefore approximately 10 mA, increasing up to 45 mA. In the same example diagram of FIG. 2, the behavior of a signal-to-intermodulation ratio IM3 in dB (on the right side) for an input power $P_{in}$ of −1 dBm is also represented by the emitter current $I_E$ for the circuit 1 of FIG. 1. In particular embodiments, the signal-to-intermodulation ratio IM3 drops significantly with decreasing emitter current $I_E$. At 10 mA, the signal-to-intermodulation ratio IM3 has already dropped to a value of merely 40 dB. In particular embodiments, for an emitter current $I_E$ larger than 40 mA, a signal-to-intermodulation ratio IM3 of approximately 80 dB may be achieved.

In the example of FIG. 1, the circuit 1 has a coupling device 60, which is connected to the emitter (input) of the transistor Q and to the collector (output) of the transistor Q. The coupling device 60 of FIG. 1 produces a negative feedback by a transformer coupling M. The coupling device 60 has a first inductance that is connected to the collector (output) of the transistor Q. The coupling device 60 furthermore has a second inductance that is connected to the emitter (input) of the transistor Q. The first inductance and the second inductance of the coupling device 60 are inductively coupled for the formation of the transformer coupling.

In FIG. 1, the input a of the amplifier 10 is connected with the antenna 90 via a bandpass filter 70, so that the received RF signal from the antenna 90 is filtered by the bandpass filter 70 and reaches the emitter of the transistor Q via the first inductance of the coupling device 60.

In particular example embodiments illustrated In FIG. 1, the coupling device 60 may have a large capacitance $C_{FB}$, which decouples the second inductance of the coupling device 60 in terms of DC current, so that no DC current may flow via the second inductance of the coupling device 60, wherein the capacitance $C_{FB}$ on the other hand has no effect on the frequency response of the coupling device 60. The capacitance $C_K$ decouples the second inductance of the coupling device 60 in terms of DC current.

Figure 3:
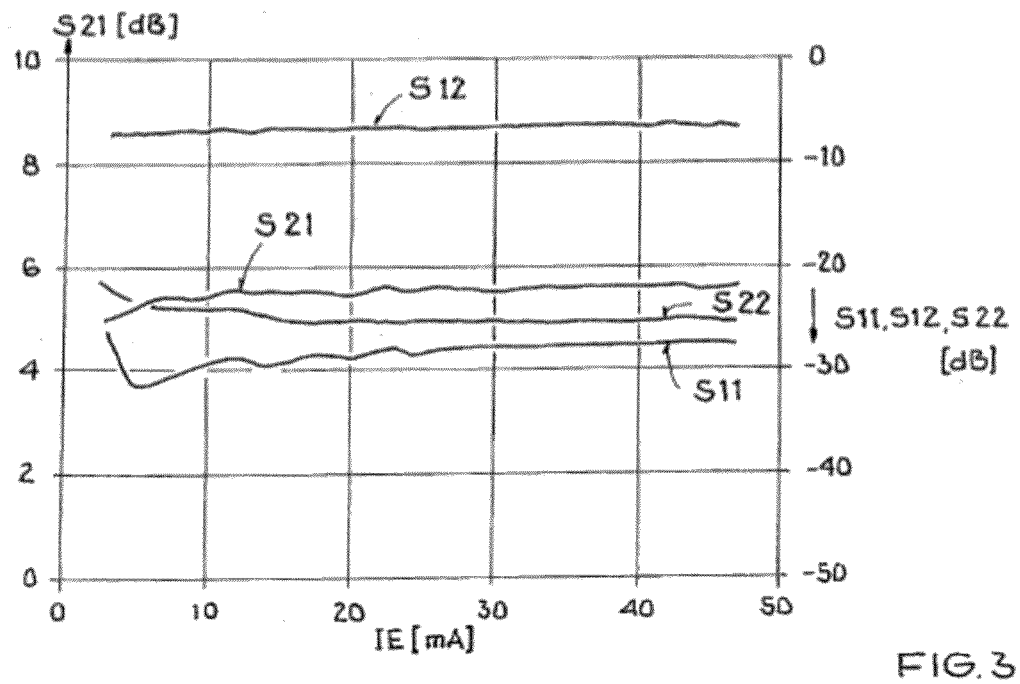
FIG. 3 is a schematic diagram of example scattering parameters dependent upon the emitter current.

In particular embodiments, if the amplifier 10 is negatively coupled by the coupling device 60, scattering parameter trajectories of the amplifier 10 may be achieved dependent upon the emitter current $I_E$ as shown in the diagram in FIG. 3. By the transformer coupling M of the coupling device 60, in particular embodiments, the scattering parameters S11, S12, S21, S22 of the amplifier 10 change only insignificantly above 10 mA emitter current $I_E$ with increasing emitter current $I_E$. The behaviors of the scattering parameters S11, S12, S21, S22 of amplifier 10 are determined between points a and b of the amplifier 10 in this example of FIG. 1. Changing the emitter current $I_E$ between 10 mA and 45 mA, changes the amplification defined by the scattering parameters S11, S12, S21, S22 of the amplifier 10 only insignificantly. Due to the transformer coupling M of the coupling device 60, particularly constant behaviors for the scattering parameters S11, S12, S21, S22 of the amplifier may be achieved. In particular embodiments, the noise ratio NF and the signal-to-intermodulation ratio IM3 of the amplifier 10 depend on the operating point current and therefore on the emitter current $I_E$, wherein the noise ratio NF and the signal-to-intermodulation ratio IM3 of the amplifier 10 may not be jointly optimized for a single emitter current value, as represented in FIG. 2. In particular embodiments, however, the amplification of the amplifier 10 may be largely constant in a permissible range of the emitter current $I_E$ between 10 mA and 45 mA.

In FIG. 1, the emitter current $I_E$ is adjusted by the base voltage $U_B$. For adjusting the base voltage $U_B$, the circuit 1 has a data-entry device 20, a reference voltage source 40, and a control device 30.

In particular embodiments, the data-entry device 20 is connected to the output of the amplifier 10. The data-entry device 20 is set up for the output of a rectified voltage $U_{gI}$ by rectification of the output signal of the amplifier 10. For this purpose, the data-entry device 20 of FIG. 1 has a voltage rectifier with a high-resistance input. The rectified voltage $U_{gI}$ in this context also depends on the output power $P_{out}$ via an output voltage of the amplifier 10. Due to the merely insignificantly varying scattering parameters S11, S12, S21, S22 of the negatively coupled rectifier 10 (see FIG. 3), the amplification in the example of FIG. 3 is essentially constant. In particular embodiments, for example, the rectified voltage $U_{gI}$ thus also depends of the input power $P_{in}$ on the input of the amplifier 10, proportional to the input power $P_{in}$.

In particular embodiments, the control device 30 is connected on the base of the transistor Q of the amplifier 10, on the data-entry device 20, and on the reference voltage source 40 for controlling the operating point of the transistor Q. The reference voltage source 40 is set up for output of a reference voltage $U_{ref}$. In particular embodiments, for example, the reference voltage source 40 may have a bandgap voltage source. The reference voltage source 40 may in addition have a voltage divider for adjusting the reference voltage $U_{ref}$. To minimize temperature dependence of the base voltage $U_B$, both the reference voltage source 40 as well as the control device 30 are designed for temperature compensation.

Figure 4:
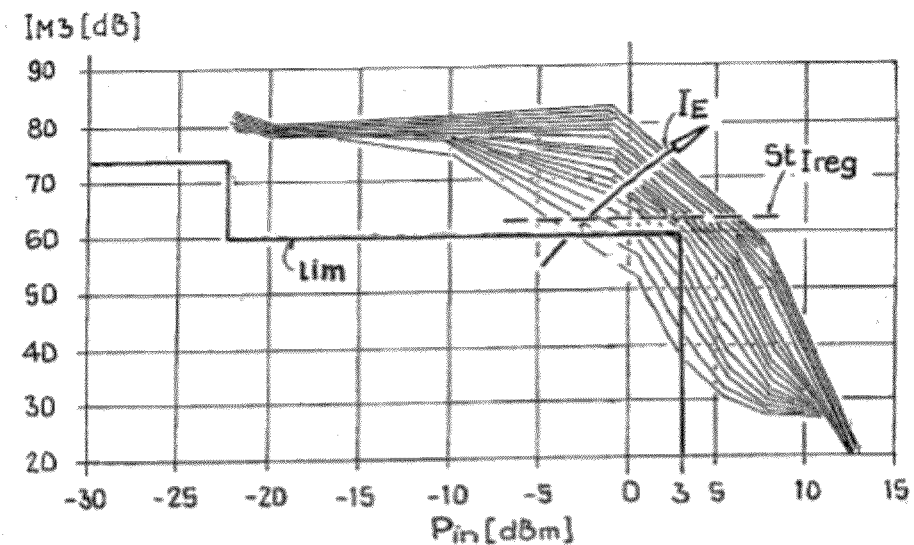
FIG. 4 is a schematic diagram of example signal-to-intermodulation ratios dependent upon the emitter current.

In particular embodiments, the base voltage $U_B$ on transistor Q is controlled by means of the control device 30 dependent upon the rectified voltage $U_{gI}$ and the reference voltage $U_{ref}$, in order to improve the amplification characteristics, in particular the signal-to-intermodulation ratio IM3. FIG. 4 is an example diagram that shows the signal-to-intermodulation ratio IM3 of intermodulation distortions of the third order in dB via the input power $P_{in}$ in dBm for different emitter currents $I_E$. In FIG. 4, the signal-to-intermodulation ratio IM3 is approximately 80 dB at a small input power $P_{in}$ of −20 dBm to −30 dBm. The signal-to-intermodulation ratio IM3 decreases significantly with increasing input power $P_{in}$ so that the distortions of the received RF signal by the amplifier 10 increase markedly. In this connection, the decrease of the signal-to-intermodulation ratio IM3 is dependent on the emitter current $I_E$ in the operating point of the transistor Q of the amplifier 10. With increasing emitter current $I_E$, signified by an arrow in FIG. 4, the signal-to-intermodulation ratio IM3 drops only with higher input power $P_{in}$ levels.

FIG. 4 shows an example of a step behavior of a minimum value lim of the signal-to-intermodulation ratio IM3 schematically. In particular embodiments, the signal-to-intermodulation ratio IM3 must not drop below the limit value behavior lim. FIG. 4 illustrates a dashed control transmission $St_{Ireg}$, along which the emitter current $I_E$ is controlled by means of a characteristic curve dependent upon the input power $P_{in}$. In particular embodiments of the characteristic curve, the emitter current $I_E$ of the transistor Q of the negatively coupled, low-noise amplifier 10, is raised with increasing input power $P_{in}$ such that a specified signal-to-intermodulation ratio IM3 is maintained along the control transmission $St_{Ireg}$ by means of a characteristic curve control.

In particular embodiments, where the reception is mostly at low level, the amplifier 10 may be operated with a lower, but constant emitter current $I_E$ such that it works in an operating point for a minimal noise factor NF. An example of a characteristic curve for control of the emitter current $I_E$ depending upon the output power $P_{out}$ is schematically represented in FIG. 5.

Figure 5:
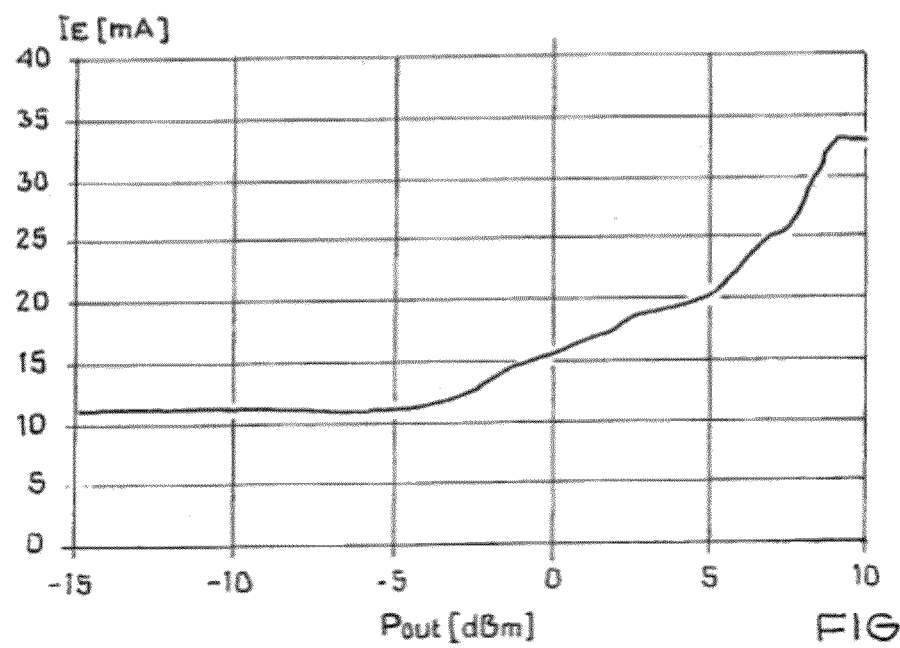
FIG. 5 is a schematic characteristic curve of an example controlled emitter current dependent upon an output power.

In particular embodiments of the characteristic curve control, as illustrated in FIG. 5, the data-entry device 20 and the control device 30 are set up to adjust the base voltage $U_B$ on the base of the transistor Q of the amplifier 10 by summation of the reference voltage $U_{ref}$ and at least from a voltage $U_K$, $U_{lim1}$, $U_{lim2}$ derived from the rectified voltage $U_{gI}$. The control device 30 is designed as a so-called adjustable function network. In the example of FIG. 1, the control device 30 has an analog adder 31, which adds the reference voltage $U_{ref}$, a first voltage $U_{lim1}$ derived from the rectified voltage $U_{gI}$, a second voltage $U_{lim2}$ derived from the rectified voltage $U_{gI}$, and a third voltage $U_K$ derived from the rectified voltage $U_{gI}$, and outputs the base voltage $U_B$.

In particular embodiments of the first derived voltage $U_{lim1}$, a lower limitation of the emitter current $I_E$ is generated that, as demonstrated in FIG. 5, due to the first derived voltage $U_{lim1}$, does not drop below 12 mA and that is essentially constant below −5 dBm output power $P_{out}$ because of the first derived voltage $U_{lim1}$. In particular embodiments, the first analog arithmetic circuit 33 of the control circuit 30 is formed by means of a first threshold value, for example, which is assigned to the −5 dBm output power $P_{out}$, to keep the sum on the output of the adder 31 constant for lower output power $P_{out}$ levels.

In particular embodiments of the first derived voltage $U_{lim2}$, an upper limitation of the emitter current $I_E$ is generated that, as demonstrated in FIG. 5, due to the second derived voltage $U_{lim2}$, does not exceed 33 mA and that is essentially constant above +9 dBm output power $P_{out}$ because of the second derived voltage $U_{lim2}$. In particular embodiments, the analog arithmetic circuit 33 of the control circuit 30 is formed by means of a second threshold value that is assigned to the +9 dBm output power $P_{out}$ levels to keep the sum on the output of the adder 31 constant for higher output power $P_{out}$ levels. In particular embodiments, for example, the second derived voltage $U_{lim2}$, may enter into the summation as a negative value. In particular embodiments, the power loss of the transistor Q in particular may be limited to a permissible range.

In particular embodiments of the third derived voltage $U_K$, a slope of the emitter current $I_E$ between −5 dBm and +9 dBm output power $P_{out}$ may be generated. By means of this slope, the steepness of the control characteristics $St_{Ireg}$ (refer to FIG. 4) may be defined. The analog arithmetic circuit 32 of the control circuit 30 may be designed, for example, to multiply the rectified voltage $U_{gI}$ with a factor. The factor may be adjusted by means of the control voltage $U_{S3}$ on the control input 35 of the control device. The lower threshold value may be adjusted by the voltage $U_{S1}$ on the control input 37 and the upper threshold by the voltage $U_{S2}$ on the control input 36 of the control device 30.

In FIG. 1, the data-entry device 20, the control device 30, and the reference voltage source 40 may be monolithically integrated on a semiconductor chip. The networks 50, 80 and the coupling device 60 may be connected as external components to the connections of the semiconductor chip. During high frequencies of the received RF signal, the coupling device 60 or the antenna 90 may also be monolithically integrated on the semiconductor chip 60 together with the amplifier 10.

Figure 6:
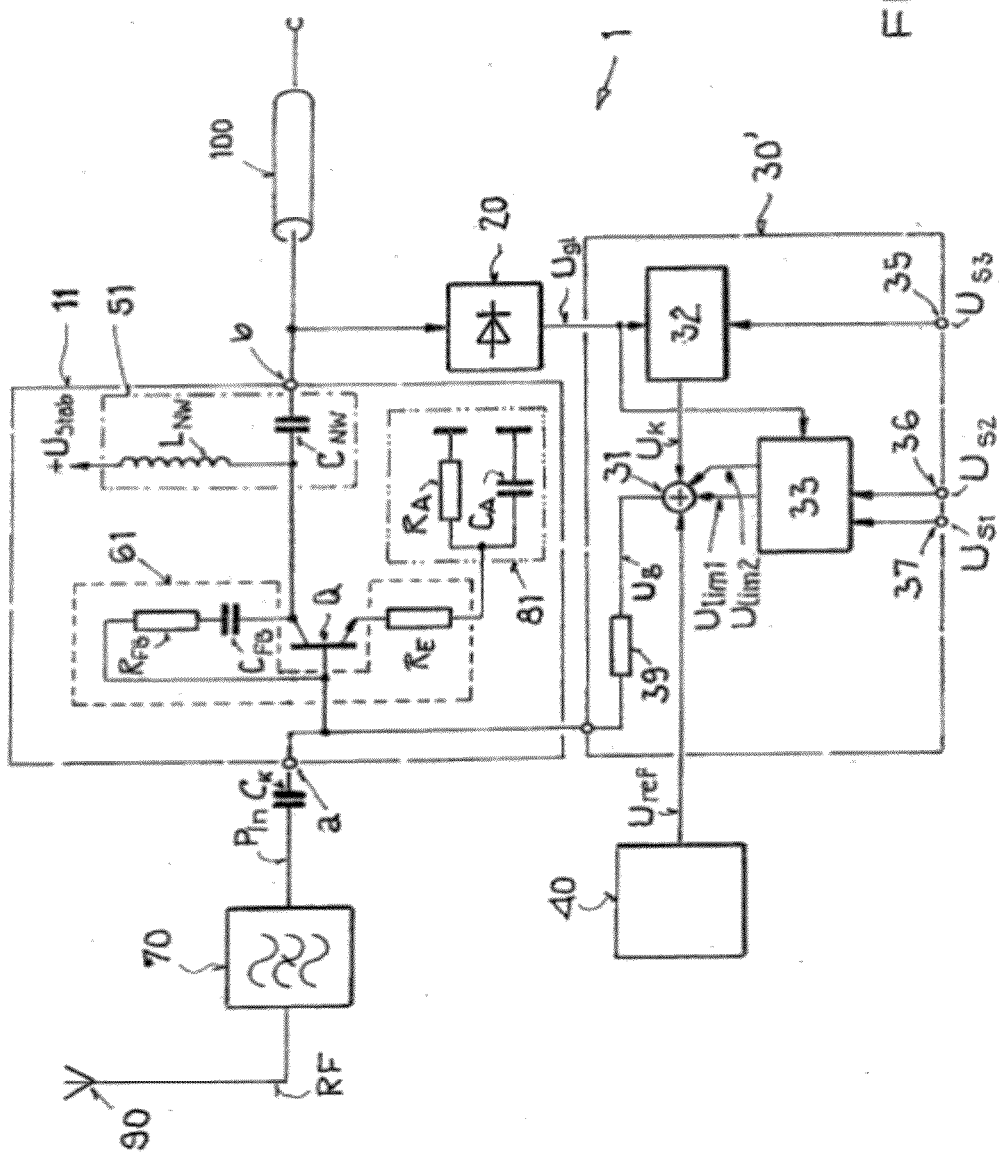
FIG. 6 is a schematic circuit diagram of another example embodiment.

FIG. 6 illustrates a further example embodiment of a circuit 1 for amplification of an incoming RF signal received via an antenna 90. An input a of the amplifier 11 may again be connected via a bandpass filter 70 with the antenna 90.

In particular embodiments, a transistor Q is interposed in the emitter circuit as a npn-bipolar transistor and may be operated in an operating point for the amplification of the received RF signal. The transistor Q is connected with a coupling device 61 for negative feedback. The coupling device 61 is a resistive negative coupling, which has a first resistor $R_{FB}$ and a second resistor $R_E$. For negative coupling, the first resistor $R_{FB}$ connects the collector of the transistor Q with a base of the transistor Q. By means of the capacitance $C_{FB}$, the base of the transistor Q is decoupled from the collector of the transistor Q in terms of DC current. The second resistor $R_E$ is connected to an emitter of the transistor Q and may act as negative current feedback. In particular embodiments, the first resistor $R_{FB}$ and the second resistor $R_E$ may define the negative coupling and therefore the amplification of the amplifier 11.

In the example of FIG. 6, a data-entry device 20 is connected to the output b of the amplifier 10 and not to the collector of the transistor Q. A network 51 with the inductance $L_{NW}$ and the capacitance $C_{NW}$ is interposed for adaptation between the output b of the amplifier 11 and the transistor Q.

In particular embodiments, the data-entry device 20, a reference voltage source 40, and a control device 30' are connected with each other in order to provide a control voltage $U_B$ on the output of the control device 30'. In FIG. 6, the control voltage $U_B$ is the base voltage $U_B$ of the transistor Q.

In particular embodiments, the impedance 39 at the output of the control device 30' is designed with high ohmic resistance for the received RF signal. In particular embodiments, for example, the impedance 39 may be a high ohmic resistance or an inductance.

In particular embodiments, the operating point of the transistor Q is controlled by means of the base voltage $U_B$. For that purpose, the control device 30' may be set up to adjust the base voltage $U_B$ as control voltage $U_B$ by summation of the reference voltage $U_{ref}$ and at least one voltage $U_K$, $U_{lim1}$, $U_{lim2}$, derived from the rectified voltage $U_{gI}$, wherein the base voltage $U_B$ and the sum of the resistances $R_E$ and $R_A$ define the operating point of the transistor Q. In particular embodiments, the resistance $R_A$ of the network 81 may be short-circuited by the parallel switched capacitance $C_A$ in terms of alternating current.

Figure 7:
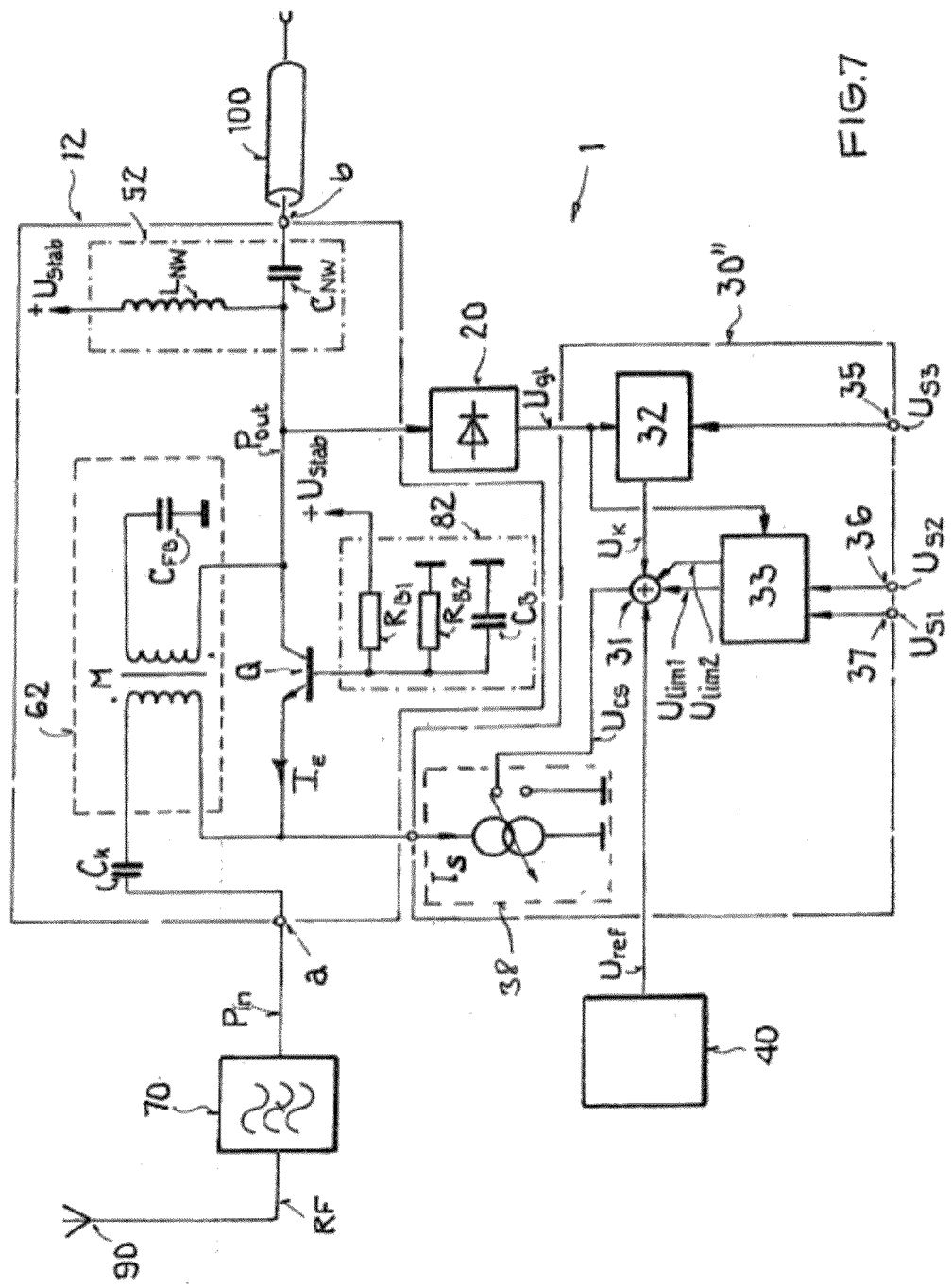
FIG. 7 is a schematic circuit diagram of yet another example embodiment.

FIG. 7 illustrates another example embodiment of a circuit 1 for amplification of an incoming RF signal received via an antenna 90. In particular embodiments, one input a of the amplifier 12 is connected with the antenna 90 and one output b of the amplifier 12 is connected with the coaxial cable 100. The amplifier 12 has a transistor Q in a common base connection, which may be operated for amplification of the received RF signal in an operating point. In particular embodiments, the operating point of the transistor Q is based upon the control current $I_S$, which flows as emitter current $I_E$ through the transistor Q. One base of the transistor Q is connected by means of the network 82. In particular embodiments of the network 82, the base of the transistor Q may be connected to a center tap of a voltage divider from the resistors $R_{B1}$ and $R_{B2}$. The capacitance $C_B$ connected on the base of the transistor Q may produce a short circuit to ground for alternating currents.

In FIG. 1, the transistor Q is connected with a coupling device 62 for transformer negative coupling, in that a transformer is connected to a collector and to an emitter of the transistor Q.

In particular embodiments, the operating point of the transistor Q is adjustable through a voltage-controlled current source 38 of the control device 30", in that the voltage-controlled current source 38 impresses the emitter current $I_E$ into transistor Q by means of the control current $I_S$.

In particular embodiments, the emitter current $I_E$ is adjusted in that a rectified voltage $U_{gI}$ is generated and output by rectification of the output signal of the transistor Q by means of the data-entry device 20 connected to the collector of the transistor Q. A constant reference voltage $U_{ref}$ is output by means of a reference voltage source 40.

In particular embodiments, for the control of the operating point of the transistor Q, the control device 30" is connected with the data-entry device 20 and with the reference voltage source 40. The control device 30" is set up to adjust the control current $I_E$ by summation of the reference voltage $U_{ref}$ and at least one voltage $U_K$, $U_{lim1}$, $U_{lim2}$ derived from the rectified voltage $U_{gI}$, wherein the operating point of the transistor Q is based upon the control current $I_S$. In this context, the control current $I_S$ in the example of FIG. 7 is generated by the voltage-controlled current source 38 from the output voltage $U_{CS}$ of the analog adder 31.

Particular embodiments are not limited to the example embodiments in FIGS. 1 to 7. Particular embodiments, for example, create a different form of the control characteristics. Particular embodiments provide another transistor or another interconnection of the transistor of the amplifier. In particular embodiments, the circuit 1 of FIG. 1 may also be combined with an AGC, if high input levels may occur.

In particular embodiments, the adjustment of the operating point may not have any AGC characteristics itself by means of the control voltage or the control current and for that reason has no unfavorable impact on the additional AGC. The functionality of the example circuit in FIG. 1 may be particularly advantageous for an HF receiver of an infotainment system of a motor vehicle.

The following is a list of reference symbols and numbers in FIGS. 1 to 7, provided for example illustration purposes only and not by way of limitation:

1 Circuit
10, 11, 12 Amplifier
20 Data-entry terminal, rectifier
30, 30', 30" Control device
31 Adder
32, 33 Analog computer
34 Output
35, 36, 37 Control input
38 Voltage-controlled current source
39 Impedance
40 Reference voltage source
50, 51, 52, 80, 81, 82 Network
60, 61, 62 Coupling device
70 Bandpass filter
90 Antenna
100 Transmission line, Coaxial cable
$C_A$, $C_B$, $C_{FB}$, $C_{NW}$, $C_K$ Capacitance
$L_{NW}$, $L_A$ Inductance
M Transformer coupling
Q Transistor
$R_A$, $R_{B1}$, $R_{B2}$, $R_E$, $R_{FB}$ Resistor
$U_{CS}$, $U_{ref}$, $U_{lim1}$, $U_{lim2}$, $U_K$, Voltage
$U_{gl}$, $U_{Stab}$, $U_{S1}$, $U_{S2}$, $U_{S3}$
$I_S$, $I_E$ Current
NF Noise factor
RF Incoming signal
$P_{in}$ Input power
$P_{out}$ Output power
S11, S12, S21, S22 Scattering parameters Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An apparatus comprising:
    an antenna for receiving a radio frequency (RF) signal; and
    an amplifier comprising a transistor operating in an operating point of the received RF signal, the operating point being based on a control voltage or a control current, the transistor being coupled to:
        a coupling device configured to produce negative feedback for linearizing the amplifier;
        a data-entry device configured to output a rectified voltage by rectification of an output signal of the transistor;
        a reference-voltage source configured to output a reference voltage; and
        a control device configured to adjust the control voltage or the control current by summing the reference voltage and a first voltage derived from the rectified voltage.

2. The apparatus of claim 1, wherein the coupling device is configured for transformer coupling.

3. The apparatus of claim 1, wherein the coupling device is configured for resistive coupling.

4. The apparatus of claim 1, wherein the control voltage is based on a base voltage of the transistor and the control device is configured to output the base voltage.

5. The apparatus of claim 4, wherein the control device adjusts the control voltage or the control current by controlling the emitter current through the transistor along a characteristic curve depending on the rectified voltage.

6. The apparatus of claim 1, wherein the reference voltage source and the control device are configured compensate for temperature.

7. The apparatus of claim 1, wherein the control current is based on an emitter current through the transistor and the control device is configured to output the emitter current.

8. The apparatus of claim 7, wherein the control device adjusts the control voltage or the control current by controlling the emitter current through the transistor along a characteristic curve depending on the rectified voltage.

9. The apparatus of claim 8, wherein the control device is further configured to:
    generate a lower current limitation of the characteristic curve of the emitter current based on the first voltage derived from the rectified voltage;
    generate an upper current limitation of the characteristic curve of the emitter current based on a second voltage derived from the rectified voltage; and
    determine a slope of the characteristic curve between the lower and upper current limitations based on a third voltage derived from the rectified voltage from which a control characteristic is defined.

10. A method comprising:
    receiving a radio frequency (RF) at an antenna;
    generating negative feedback to linearize an amplifier by resistively coupling an output signal of a transistor of the amplifier to the input of the transistor;
    generating a rectified voltage by rectification of the output signal of the transistor;
    generating a constant reference voltage; and
    outputting a control voltage or a control current to the transistor based on the sum of the reference voltage and a first voltage derived from the rectified voltage, output of the control voltage or control current facilitating control of an operating point of the transistor.

11. The method of claim 10, wherein the control voltage or the control current is adjusted based on an emitter current through the transistor along a characteristic curve depending on the rectified voltage.

12. A system comprising:
an antenna for receiving a radio frequency (RF) signal;
a bandpass filter for filtering the received RF signal;
an amplifier comprising a transistor operating in an operating point of the received RF signal, the operating point being based on a control voltage or a control current, the transistor being coupled to:
  a coupling device configured to produce negative feedback for linearizing the amplifier;
  a data-entry device configured to output a rectified voltage by rectification of an output signal of the transistor; and
  a reference-voltage source configured to output a reference voltage;
a control device configured to adjust the control voltage or the control current by summing the reference voltage and a first voltage derived from the rectified voltage; and
a transmission line coupled to an output of the amplifier.

13. The system of claim 12, wherein the coupling device is configured for transformer coupling.

14. The system of claim 12, wherein the coupling device is configured for resistive coupling.

15. The system of claim 12, wherein the control voltage is based on a base voltage of the transistor and the control device is configured to output the base voltage.

16. The system of claim 15, wherein the control device adjusts the control voltage or the control current by controlling the emitter current through the transistor along a characteristic curve depending on the rectified voltage.

17. The system of claim 12, wherein the reference voltage source and the control device are configured compensate for temperature.

18. The system of claim 12, wherein the control current is based on an emitter current through the transistor and the control device is configured to output the emitter current.

19. The system of claim 18, wherein the control device adjusts the control voltage or the control current by controlling the emitter current through the transistor along a characteristic curve depending on the rectified voltage.

20. The system of claim 19, wherein the control device is further configured to:
generate a lower current limitation of the characteristic curve of the emitter current based on the first voltage derived from the rectified voltage;
generate an upper current limitation of the characteristic curve of the emitter current based on a second voltage derived from the rectified voltage; and
determine a slope of the characteristic curve between the lower and upper current limitations based on a third voltage derived from the rectified voltage from which a control characteristic is defined.

* * * * *